United States Patent
Nakamura et al.

(10) Patent No.: US 9,257,469 B2
(45) Date of Patent: Feb. 9, 2016

(54) COLOR IMAGING DEVICE

(75) Inventors: Tatsuya Nakamura, Osaka (JP); Seiji Nishiwaki, Hyogo (JP); Shinichi Wakabayashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 141 days.

(21) Appl. No.: 14/353,113

(22) PCT Filed: Jun. 4, 2012

(86) PCT No.: PCT/JP2012/003647
§ 371 (c)(1),
(2), (4) Date: Apr. 21, 2014

(87) PCT Pub. No.: WO2013/061489
PCT Pub. Date: May 2, 2013

(65) Prior Publication Data
US 2014/0263968 A1 Sep. 18, 2014

(30) Foreign Application Priority Data
Oct. 24, 2011 (JP) ................. 2011-233303

(51) Int. Cl.
*H01L 27/146* (2006.01)
*H01L 51/52* (2006.01)
*H04N 9/04* (2006.01)
*H04N 9/097* (2006.01)

(52) U.S. Cl.
CPC .... *H01L 27/14625* (2013.01); *H01L 27/14623* (2013.01); *H01L 27/14645* (2013.01); *H04N 9/045* (2013.01); *H04N 9/097* (2013.01)

(58) Field of Classification Search
CPC ............. H01L 27/14625; H01L 27/14623; H01L 27/14645; H01L 9/045; H01L 9/097
See application file for complete search history.

(56) References Cited

U.S. PATENT DOCUMENTS

| | | |
|---|---|---|
| 2008/0315074 A1 | 12/2008 | Konno et al. |
| 2009/0303371 A1 | 12/2009 | Watanabe et al. |
| 2010/0176473 A1 | 7/2010 | Nishiwaki |

(Continued)

FOREIGN PATENT DOCUMENTS

| | | |
|---|---|---|
| JP | 2006-222270 A | 8/2006 |
| JP | 2009-004533 A | 1/2009 |

(Continued)

OTHER PUBLICATIONS

International Search Report for corresponding International Application No. PCT/JP2012/003647 mailed Aug. 7, 2012.

(Continued)

*Primary Examiner* — Renee D Chavez
(74) *Attorney, Agent, or Firm* — Renner, Otto, Boisselle & Sklar, LLP

(57) ABSTRACT

An imaging apparatus 10 according to one implementation of the present invention includes: a plurality of photodetectors 5a and 5b; a transparent layer 2 provided at the side of a light-receiving surface 15a, 15b of the photodetectors 5a and 5b; a plurality of spectroscopic portions 3 provided between a light-entering surface 2a of the transparent layer 2 and the photodetectors 5a and 5b; and a plurality of high refractive index transparent members 6 provided closer to the photodetectors 5a and 5b than are the spectroscopic portions 3. The high refractive index transparent members 6 have a higher refractive index than does the transparent layer 2.

8 Claims, 11 Drawing Sheets

(56) References Cited

U.S. PATENT DOCUMENTS

| | | |
|---|---|---|
| 2010/0188537 A1 | 7/2010 | Hiramoto et al. |
| 2010/0289100 A1 | 11/2010 | Otsuka et al. |
| 2011/0096210 A1 | 4/2011 | Koshino et al. |
| 2011/0192962 A1* | 8/2011 | Nishiwaki ............ G02B 5/1871 250/226 |

FOREIGN PATENT DOCUMENTS

| | | |
|---|---|---|
| JP | 2010-267828 A | 11/2010 |
| JP | 2010-287627 A | 12/2010 |
| JP | 2011-103349 A | 5/2011 |
| WO | WO 2009/019818 A1 | 12/2009 |
| WO | WO 2009/153937 A1 | 12/2009 |
| WO | WO 2010/016195 A1 | 12/2010 |

OTHER PUBLICATIONS

Form PCT/IPEA/409 for corresponding International Application No. PCT/JP2012/003647 mailed May 21, 2013.

* cited by examiner (a)

(b)

(c)

(d)

COLOR IMAGING DEVICE

TECHNICAL FIELD

The present application relates to a technique of enhancing the sensitivity of an imaging apparatus.

BACKGROUND ART

In recent years, the increased numbers of pixels in digital cameras and digital movie cameras have necessitated miniaturization of cell sizes in CCD structures, CMOS structures, and the like. However, miniaturized cell sizes introduce a physical decrease in the geometric area in which light is received, thus lowering the amount of received light. Therefore, what is needed in the future is imaging structures for introducing an increase, even if only a little, in the efficiency of light utilization.

Patent Document 1 proposes an imaging apparatus without color filters which is meant to provide an improved efficiency of light utilization. Light entering the imaging apparatus passes through a plate-like transparent spectroscopic portion which has a higher refractive index than do the surroundings, whereby $0^{th}$ order light and $\pm 1^{st}$ order light of respectively different wavelengths occur. It is designed so that the resultant $0^{th}$ order light and $\pm 1^{st}$ order light enter respectively different photodetectors. The proposal is to, by using such a transparent spectroscopic portion, enhance the efficiency of light utilization over that of conventional imaging apparatuses in which color filters are employed.

Patent Document 2 discloses an inner-layer lens as a converging device in an imaging apparatus, where light convergence is enhanced through a lens effect. Patent Document 3 discloses an optical waveguide, as a converging device in an imaging apparatus.

CITATION LIST

Patent Literature

[Patent Document 1] the pamphlet of International Publication No. 2009/019818
[Patent Document 2] Japanese Laid-Open Patent Publication No. 2011-103349
[Patent Document 3] Japanese Laid-Open Patent Publication No. 2006-222270

SUMMARY OF INVENTION

Technical Problem

In constructions where the spectroscopic portion described in Patent Document 1 mentioned above is applied to an imaging apparatus, it is also desirable to further enhance the efficiency of light utilization.

Solution to Problem

An imaging apparatus according to one implementation of the present invention comprises a plurality of photodetecting portions; a transparent layer provided at the side of a light-receiving surface of the plurality of photodetecting portions; a plurality of spectroscopic portions provided between a light-entering surface of the transparent layer and the plurality of photodetecting portions; and a plurality of high refractive index transparent members disposed closer to the plurality of photodetecting portions than are the plurality of spectroscopic portions, wherein the plurality of high refractive index transparent members have a higher refractive index than does the transparent layer.

Advantageous Effects of Invention

With an imaging apparatus according to one implementation of the present invention, high refractive index transparent members are disposed closer to photodetecting portions than are spectroscopic portions. As a result, light from around the high refractive index transparent members is converged, thereby allowing light to efficiently enter an aperture region which is restricted by light shielding portions.

DESCRIPTION OF EMBODIMENTS

First, a result of studying incident light amounts on photodetectors, in the case where the spectroscopic portion described in Patent Document 1 is applied to a generic imaging apparatus, will be discussed.

Figure 1:
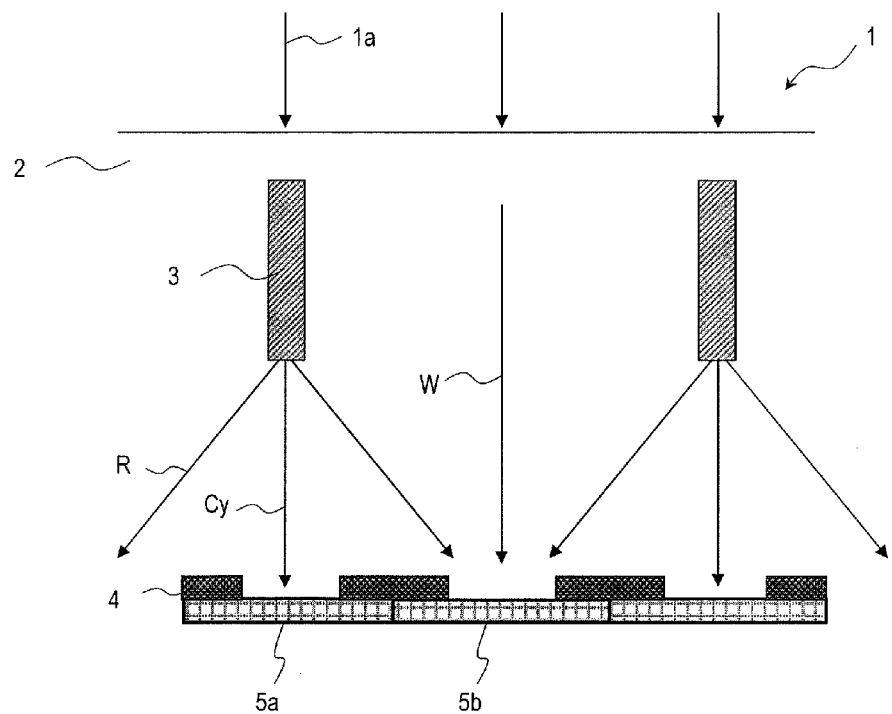
FIG. 1 A diagram showing a construction in which spectroscopic portions are applied to an imaging apparatus.

FIG. 1 is a cross-sectional view of a construction in which the spectroscopic portion described in Patent Document 1 is applied to a generic imaging apparatus. The imaging apparatus 1 shown in FIG. 1 includes: spectroscopic portions 3 being embedded in a transparent layer 2 and composed of a material which has a higher refractive index than that of the transparent layer 2; imaginary light shielding portions 4, which are meant to be interconnects, electrodes, and the like; and photodetectors 5a and 5b. In this example, it is supposed that about 40% of the aperture ratio is set by the light shielding portions 4.

Within the white light 1a which enters the imaging apparatus 1, a phase difference occurs between the light passing through any spectroscopic portion 3, which is of a high refractive index material, and the light passing through the surrounding transparent layer 2. In a manner of utilizing this phase difference, the length (i.e., length along the optical axis direction) of the spectroscopic portion 3 is adjusted so that red light is separated as $\pm 1^{st}$ order light and that cyan light, which results by removing red from white, occurs as $0^{th}$ order light. The spectroscopic portions 3 are disposed so as to correspond to every other one of the plurality of photodetectors (i.e., one for every two pixels). Then, by allowing the $\pm 1^{st}$ order light occurring from any spectroscopic portion 3 to enter its adjacent pixels, it is ensured that cyan light Cy which results by removing red from white enters the photodetector of any pixel that includes a spectroscopic portion 3 while red light R and white light W enter the photodetectors of the adjacent pixels.

Figure 2:
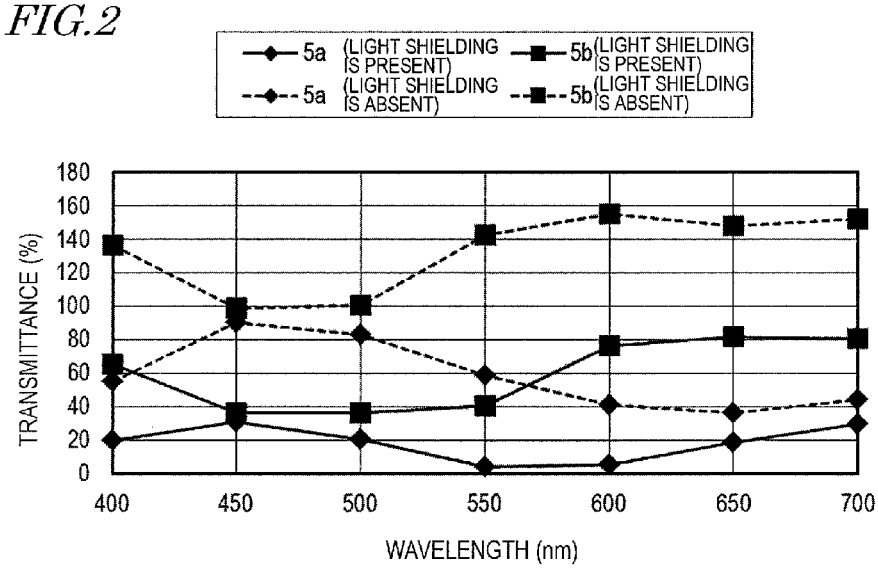
FIG. 2 A diagram showing the optical characteristics of light entering photodetectors in the case where light shielding portions exist in an imaging apparatus and in the case where they don't.

FIG. 2 shows the incident optical characteristics on the photodetectors 5a and 5b in the case where the light shielding portions 4 exist in the imaging apparatus 1 and where they don't. In FIG. 2, transmittance is represented as a value obtained by normalizing the light amount incident to each photodetector by the light amount incident to one pixel, for each wavelength. The light transmittance on each photodetector is greatly reduced because of the aperture being restricted by the light shielding portions 4. Thus, merely applying the spectroscopic portion of Patent Document 1 to an imaging apparatus causes a loss of light amount, due to the aperture being restricted by the light shielding portions and the like.

In view of the result of the above study, the inventors have vigorously worked on an imaging apparatus for allowing light to efficiently enter an aperture region that is restricted by light shielding portions.

One non-limiting, and exemplary embodiment of the present application provides an imaging apparatus with an enhanced efficiency of light utilization.

The outline of one implementation of the present invention is as follows.

An imaging apparatus according to one implementation of the present invention comprises: a plurality of photodetecting portions; a transparent layer provided at the side of a light-receiving surface of the plurality of photodetecting portions; a plurality of spectroscopic portions provided between a light-entering surface of the transparent layer and the plurality of photodetecting portions; and a plurality of high refractive index transparent members disposed closer to the plurality of photodetecting portions than are the plurality of spectroscopic portions, wherein the plurality of high refractive index transparent members have a higher refractive index than does the transparent layer.

For example, each spectroscopic portion is shaped so that a length thereof along a direction which is perpendicular to the light-receiving surface is longer than a length thereof along a direction which is parallel to the light-receiving surface; and each high refractive index transparent member is shaped so that a length thereof along a direction which is parallel to the light-receiving surface is longer than a length thereof along a direction which is perpendicular to the light-receiving surface.

For example, the spectroscopic portions are disposed so as to correspond to every other one of the plurality of photodetecting portions; and the high refractive index transparent members are disposed so as to correspond respectively to the plurality of photodetecting portions.

For example, the spectroscopic portions and the high refractive index transparent members are disposed so as to correspond respectively to the plurality of photodetecting portions.

For example, a light shielding portion is provided at a boundary portion between the photodetecting portions.

For example, the high refractive index transparent members are provided above those areas of the light-receiving surface of the plurality of photodetecting portions where the light shielding portion is not provided.

For example, an on-chip lens is provided at the side of the light-entering surface of the transparent layer.

For example, a face of each high refractive index transparent member along a direction which is parallel to the light-receiving surface is rectangular or circular.

For example, orthogonal projections of the plurality of spectroscopic portions onto the light-receiving surface do not overlap those of the plurality of high refractive index transparent members.

For example, $+1^{st}$ order diffracted light and $-1^{st}$ order diffracted light, into which light is separated as the light passes through the transparent layer and one of the spectroscopic portions, are incident on respectively different ones of the photodetecting portions; and the high refractive index transparent members are disposed so that diffraction angles of the $+1^{st}$ order diffracted light and the $-1^{st}$ order diffracted light become more spread than without the high refractive index transparent members.

For example, along a direction which is perpendicular to the light-receiving surface, the high refractive index transparent members are disposed at positions which are closer to the spectroscopic portions than to the light-receiving surface.

Hereinafter, imaging apparatuses according to Embodiments 1 to 4 of the present invention will be described.

Embodiment 1

Figure 3:
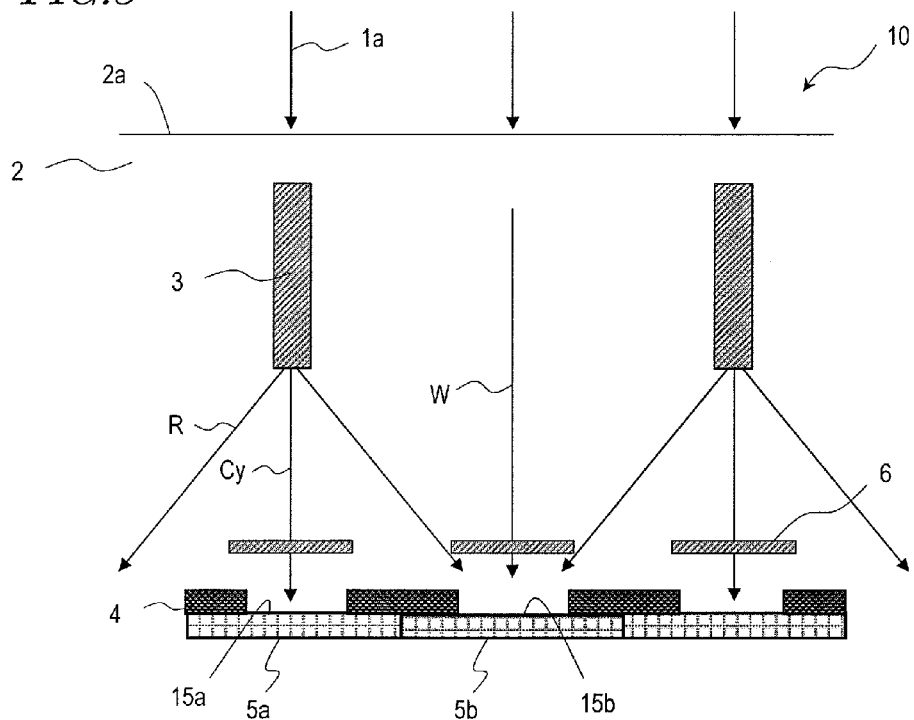
FIG. 3 A diagram showing an imaging apparatus according to an exemplary embodiment.

FIG. 3 is a cross-sectional view showing an imaging apparatus 10 according to Embodiment 1 of the present invention. In the present specification, like constituent elements will be denoted by like reference numerals, and the same description will not be repeated. In this example, the pixel cell size is supposed to be 1.4 μm.

The imaging apparatus 10 includes a plurality of photodetectors 5a and 5b, a transparent layer 2 provided at the side of the light-receiving surface 15a, 15b of the photodetectors 5a and 5b, a plurality of spectroscopic portions 3 provided between a light-entering surface 2a of the transparent layer 2 and the photodetectors 5a and 5b, and a plurality of high refractive index transparent members 6 provided closer to the photodetectors 5a and 5b than are the spectroscopic portions 3. Light shielding portions 4 are provided at boundary portions between photodetectors.

The photodetectors 5a and 5b, which are disposed in a one-dimensional or two-dimensional arrangement, function as photodetecting portions which receive light and output an electrical signal in accordance with the amount of light. The transparent layer 2 is a layer which is transparent in a visible light region of wavelengths from 400 nm to 700 nm. The spectroscopic portions 3 are covered by the transparent layer 2. The light shielding portions 4 are arranged so that the photodetectors have an aperture ratio of 40%.

The spectroscopic portions 3 are disposed so as to correspond to every other one of the plurality of photodetectors 5a and 5b. In other words, spectroscopic portions 3 are disposed on a one-for-every-two-pixels basis. The high refractive index transparent members 6 are disposed so as to correspond respectively to the plurality of photodetectors 5a and 5b.

Each spectroscopic portion 3 is shaped so that its length along a direction (optical axis direction) which is perpendicular to the light-receiving surface 15a, 15b is longer than its length along a direction which is parallel to the light-receiving surface 15a, 15b. Each high refractive index transparent member 6 is shaped so that its length along a direction which is parallel to the light-receiving surface 15a, 15b is longer than its length along a direction (optical axis direction) which is perpendicular to the light-receiving surface 15a, 15b.

The plate-like high refractive index transparent members (hereinafter referred to as high refractive index members) 6 are covered with the transparent layer 2, and are transparent in the visible light region. The high refractive index members 6 have a higher refractive index than does the transparent layer 2. Moreover, the high refractive index members 6 are disposed above those areas of the light-receiving surface of the plurality of photodetectors 5a and 5b where the light shielding portions 4 are not provided. In other words, each high refractive index member 6 is disposed so that, when viewed from the optical axis direction, large part of it overlaps an area where no light shielding portions 4 are provided.

It is assumed that the transparent layer 2 has a refractive index of 1.46, and that the thickness from the lower end of each spectroscopic portion 3 to a photodetector 5a, 5b is 3.0 µm. It is preferable that, when light entering the imaging apparatus 10 has an incident angle of 0 degrees (i.e., perpendicular to the light-entering surface 2a), the structural center of each high refractive index member 6 is located upon the center axis of the aperture.

Figure 4:
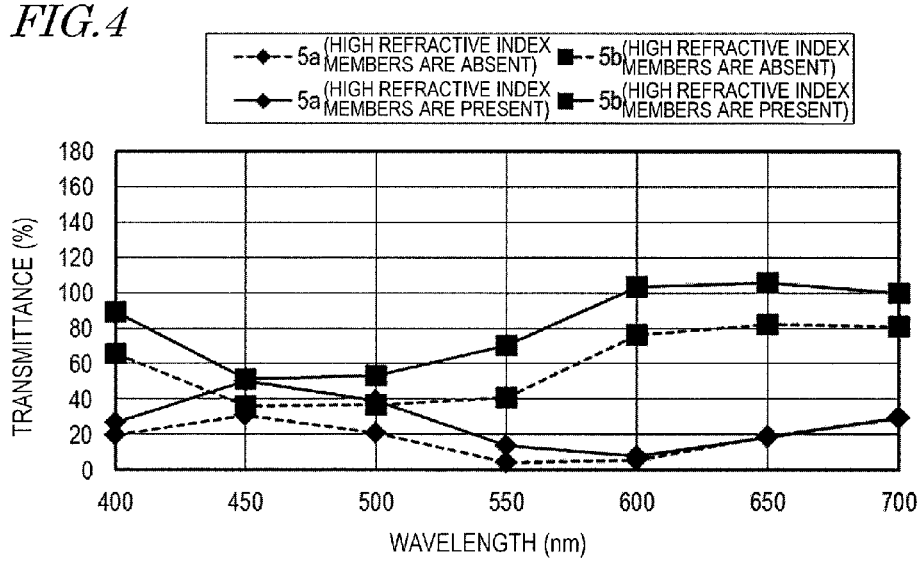
FIG. 4 A diagram showing the optical characteristics of light entering photodetectors in the case where high refractive index members according to an exemplary embodiment exist and in the case where they don't.

FIG. 4 shows the optical characteristics of light entering the surface of the photodetectors 5a and 5b, assuming that the high refractive index members 6 have a refractive index of 2.00, a height T (FIG. 5) of 0.2 µm, and a width w (FIG. 5) of 1.0 µm, and that the distance between the photodetector surface and the lower face of each high refractive index member 6 is 0.4 µm. It can be seen that deploying the high refractive index members 6 improves the light transmittance of the photodetectors 5a and 5b.

The reason why deploying the high refractive index members 6 increases transmittance will now be described.

An electric flux density D in a non-magnetic substance which is placed in an electric field E is expressed as:

$$D = \in_0 \times E + P.$$

Herein, $\in_0$ represents the dielectric constant in a vacuum. Moreover, when a polarization P and an electric field E is expressible by a linear relationship, the electric flux density D can be expressed as, by using a relative dielectric constant and the vacuum dielectric constant $\in_0$:

$$D = \in \times \in_0 \times E$$

$$\in = 1 + \chi$$

Herein, $\chi$ represents electric susceptibility.
This permits the following expression:

$$P = \in_0 \times \chi \times E.$$

On the other hand, the relative dielectric constant and the refractive index n are of the relationship:

$$\in = n2.$$

Therefore, the refractive index being large means the polarization P being large. Since polarization has a physical meaning of inducing light, light will concentrate in a region of a large refractive index n.

Figure 5:
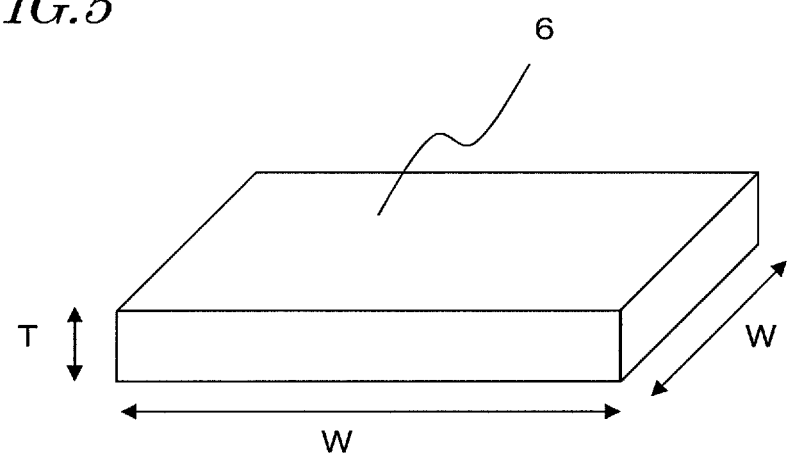
FIG. 5 A diagram showing the three-dimensional shape of a high refractive index member according to an exemplary embodiment.

FIG. 5 shows a three-dimensional shape of a high refractive index member 6 in the present embodiment. It has a rectangular planar shape and a rectangular cross-sectional shape. Ensuring this makes it unnecessary to include complicated steps in the semiconductor process.

Figure 6:
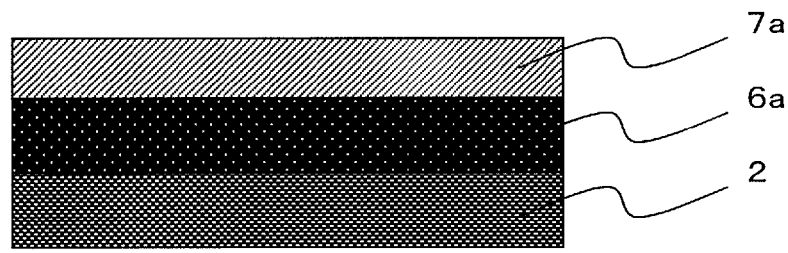
FIG. 6 (a) to (d) are diagrams showing a method of producing a high refractive index member according to an exemplary embodiment.
Figure 6:
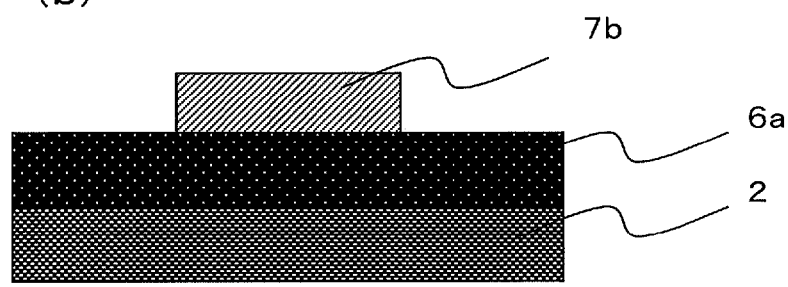
Figure 6:
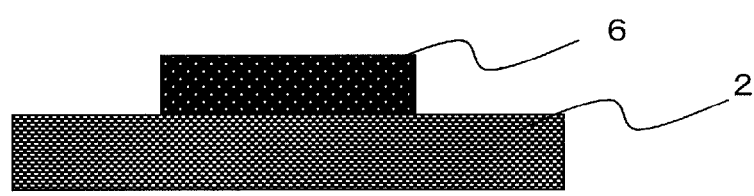
Figure 6:
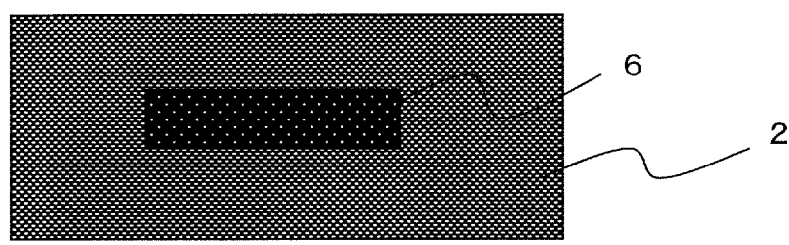

FIG. 6 shows a method of producing the high refractive index members 6. As shown in FIG. 6(a), a high refractive index layer 6a is deposited on a transparent layer 2, upon which a photoresist 7a is deposited. Next, as shown in FIG. 6(b), a resist pattern 7b is formed through photolithography. Furthermore, as shown in FIG. 6(c), the underlying high refractive index layer 6a is etched concurrently with the resist pattern 7b, and the remaining resist pattern 7b is removed by ashing or the like, thus forming the high refractive index member 6 on the transparent layer 2. Finally, as shown in FIG. 6(d), the transparent layer 2 is deposited by a CVD technique or the like, whereby the high refractive index member 6 embedded in the transparent layer 2 is formed.

An example of a converging device in a conventional imaging apparatus is an inner-layer lens as described in Patent Document 2. This has a spherical or aspherical cross-sectional shape, such that light convergence is enhanced through a lens effect. Therefore, in Patent Document 2, it is important to optimize the cross section of the inner-layer lens so as to be spherical or aspherical. From any such device utilizing a lens effect, the present embodiment differs in that convergence is effected based only on a refractive index difference with respect to the surroundings. Moreover, a lens-like cross-sectional shape is not needed in the present embodiment. This makes for a simplified process, e.g., by eliminating the photoresist reflow step that would be involved in the fabrication process of an inner-layer lens.

Another converging device in a conventional imaging apparatus is the optical waveguide described in Patent Document 3. There, the interstices between interconnection layers within a pixel region are buried with a high, refractive index material to form an optical waveguide. The optical waveguide is composed of a core with a high refractive index and a clad having a lower refractive index than that of the core. Even if incident oblique light collides against a wall of the optical waveguide, it is allowed to efficiently enter the aperture region of a photodetector via total reflection. Therefore, the length of the optical waveguide along the optical axis direction should preferably be as long as possible. On the other hand, the present embodiment is distinct from an optical waveguide because of featuring a shorter length along the optical axis direction than the width. The reason is that, rather than utilizing total reflection, the present embodiment utilizes light convergence based on a refractive index difference from the surroundings. Therefore, elongation along the optical axis direction is not necessary; in fact, elongation along a parallel direction to the photodetector is preferable.

As the material of the high refractive index members 6, silicon nitride (SiN) or a transparent oxide such as tantalum oxide or titanium oxide may be used. Without being limited to a rectangular shape, the planar shape of the high refractive index members 6 may be circular or elliptical.

As for the optical axis position of each high refractive index member 6, it is preferably placed so as to allow light to be converged on the surface of the photodetector 5a, 5b.

Note that the imaging apparatus 10 of the present embodiment may be a CCD imaging apparatus or a CMOS imaging apparatus. In either case, an imaging apparatus having a large aperture is preferable, such that efficient incidence occurs of the light from the spectroscopic portions 3 and the light which is incident on the imaging apparatus 10 to directly enter the photodetectors.

Although the present embodiment illustrates that the high refractive index members 6 are provided for all pixels, they do not need to be provided for all pixels. They may be provided for any arbitrary pixel to increase the amount of light entering the photodetector for that pixel.

The present embodiment deploys plate-like spectroscopic elements that generate diffracted light of the same color at the adjacent pixels, this being in order to demonstrate the effects of the high refractive index members 6. However, a plate-like high refractive index transparent material having stepped portions, as described in e.g. the pamphlet of International Publication No. 2010/016195, may also be combined.

Embodiment 2

Figure 7:
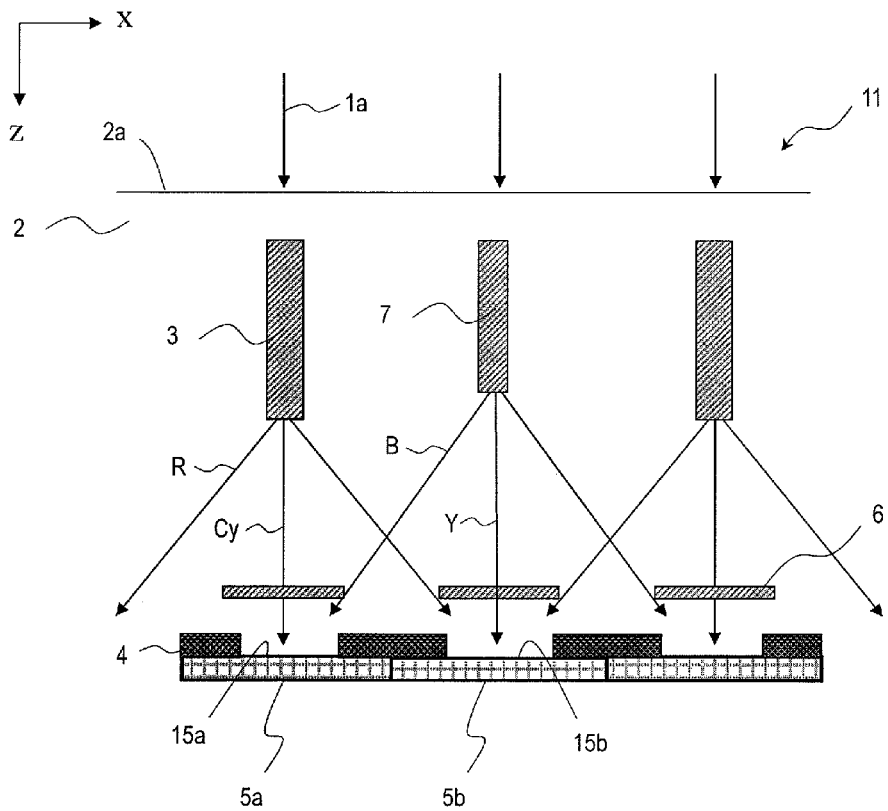
FIG. 7 A diagram showing an imaging apparatus according to an exemplary embodiment.

FIG. 7 is a cross-sectional view showing an imaging apparatus 11 according to Embodiment 2 of the present invention. As compared to the imaging apparatus 10 of Embodiment 1, the imaging apparatus 11 includes a spectroscopic portion 3 or 7 in every pixel. In this Embodiment 2, it is preferable that the structural center of each high refractive index member 6 and the pixel center are on the same line.

The spectroscopic portions 3 are disposed at pixels which include photodetectors 5a, and are provided on a one-for-every-two-pixels basis along the x direction in the figure. Their spectroscopic characteristics are identical to those of the spectroscopic portions 3 in Embodiment 1. The other spectroscopic portions 7 are disposed at pixels which include photodetectors 5b, and are provided on a one-for-every-two-pixels basis along the x direction in the figure. In other words, the spectroscopic portions 3 and the spectroscopic portions 7 alternate so that either a spectroscopic portion 3 or 7 is included in every pixel. The spectroscopic portions 7 separate blue light B as $\pm 1^{st}$ order light from the incident white light, so that yellow light Y, which results from removing blue from white, occurs as the $0^{th}$ order light. By placing the spectroscopic portions in such an arrangement, it is ensured that cyan light and blue light are incident on the photodetector 5a of any pixel that includes a spectroscopic portion 3, whereas yellow light and red light are incident on the photodetector 5b of any pixel that includes a spectroscopic portion 7.

Figure 9:
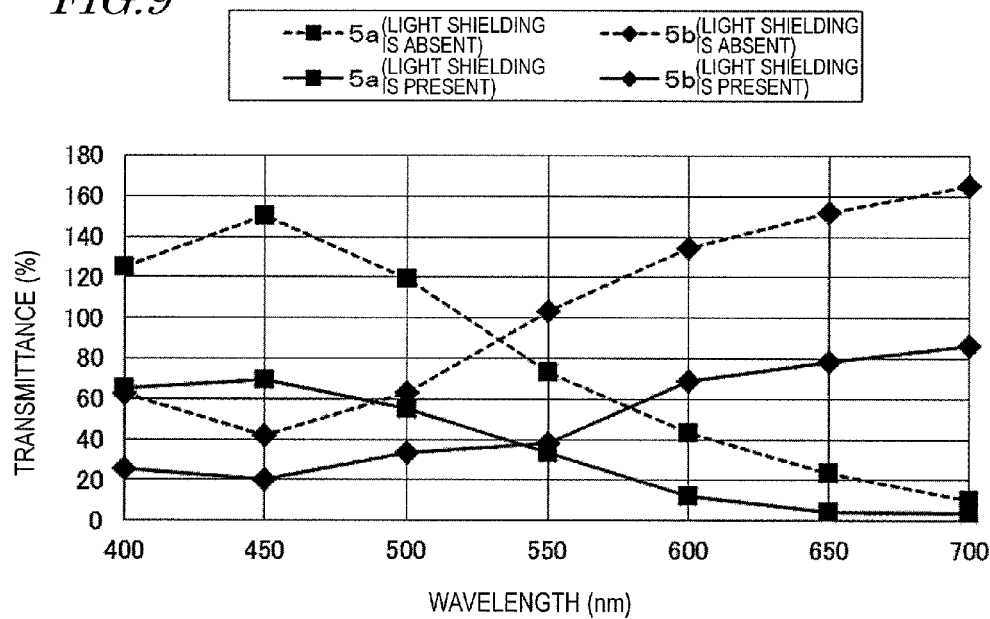
FIG. 9 A diagram showing the optical characteristics of light entering photodetectors in the case where light shielding portions exist and in the case where they don't, in an exemplary embodiment.

FIG. 9 shows, under a scenario where no high refractive index members are employed, incident optical characteristics on the photodetectors 5a and 5b in the case where light shielding portions 4 exist in the imaging apparatus 11 and in the case where they don't. In the case where the light shielding portions do not exist, cyan light and blue light are incident on the photodetectors 5a, so that the transmittance at 400 nm to 500 nm is significantly greater than the transmittance at 600 nm to 700 nm. Moreover, since yellow light and red light are incident on the photodetectors 5b, the transmittance at 600 nm to 700 nm is significantly greater than the transmittance at 400 nm to 500 nm.

However, since the aperture ratio is made 40% by the light shielding portions 4, the light transmittance on each photodetector is greatly reduced.

Figure 8:
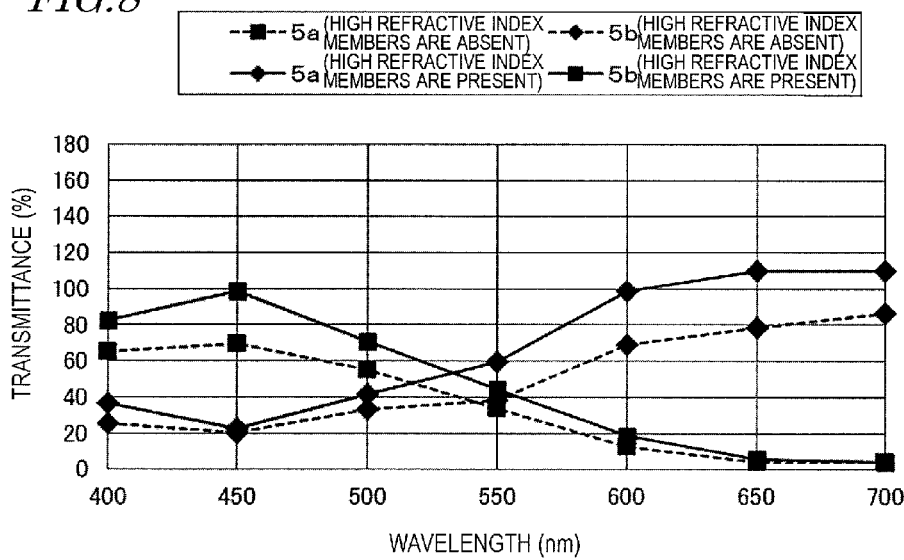
FIG. 8 A diagram showing the optical characteristics of light entering photodetectors in the case where high refractive index members according to an exemplary embodiment exist and in the case where they don't.

FIG. 8 shows, in this Embodiment 2, the optical characteristics of light entering the photodetectors 5a and 5b in the case where the high refractive index members 6 are provided and in the case where they aren't. By providing the high refractive index members 6, a greater amount of diffracted light is converged by the photodetectors 5a and 5b, whereby the incident light amount is increased.

Although this Embodiment 2 illustrates that the high refractive index members 6 have the same three-dimensional shape as that in FIG. 5, they may have a circular or elliptical planar shape.

Embodiment 3

Figure 10:
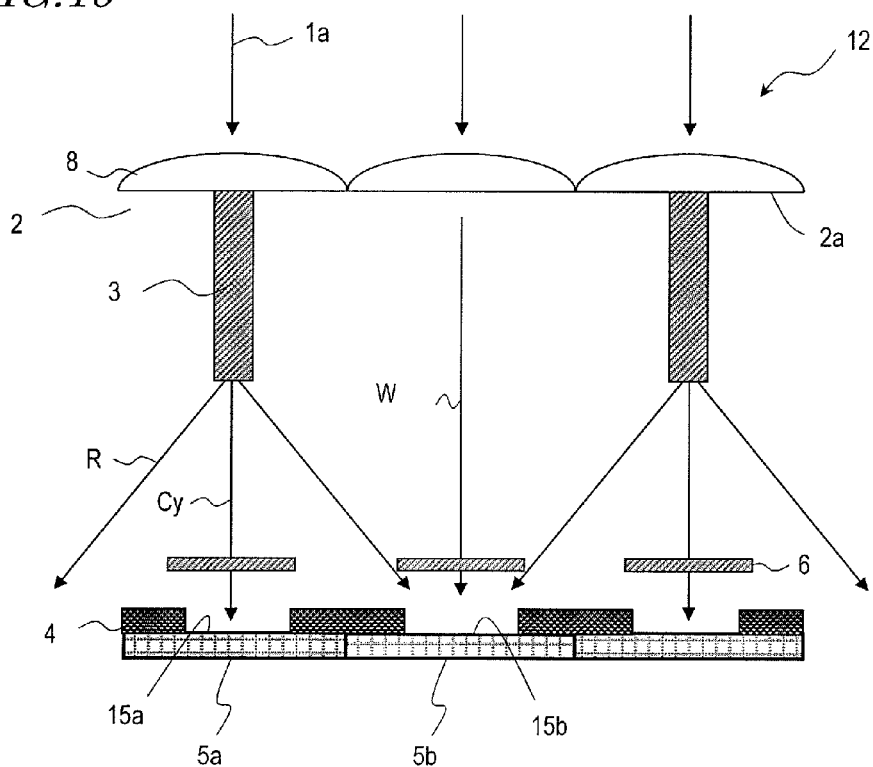
FIG. 10 A diagram showing an imaging apparatus according to an exemplary embodiment.

FIG. 10 is a cross-sectional view showing an imaging apparatus 12 according to Embodiment 3 of the present invention. In this example, the pixel cell size is 1.4 µm. The imaging apparatus 12 differs from the imaging apparatus 10 of Embodiment 1 in that on-chip lenses 8 are provided at the side of the light-entering surface 2a.

Figure 11:
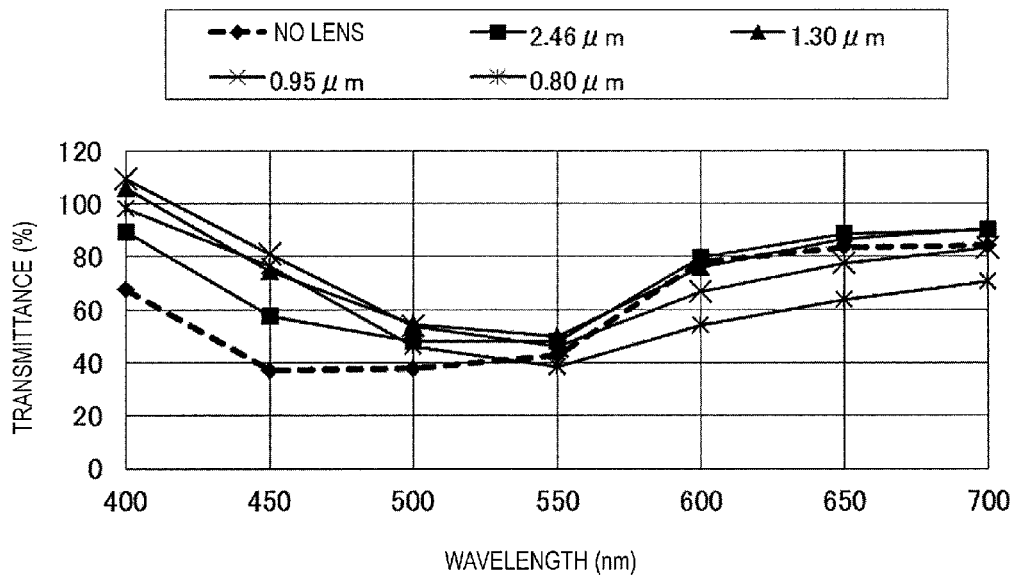
FIG. 11 A diagram showing relationships between the radius of curvature of an on-chip lens and the optical characteristics of light entering photodetectors in an exemplary embodiment.

FIG. 11 shows the optical characteristics of light entering the photodetectors 5b, where the radius of curvature of the on-chip lenses is varied. By employing the on-chip lenses, the transmittance especially at wavelengths from 400 nm to 550 nm is increased. However, since the radius of curvature is smaller than 1.30 µm, the transmittance at wavelengths from 400 nm to 550 nm increases to become about equal to or greater than the transmittance at wavelengths from 600 nm to 700 nm, whereby the color of the light entering the photodetectors 5b is affected. Moreover, at each wavelength, the transmittance under a radius of curvature of 0.80 µm is smaller than the transmittance under a radius of curvature of 0.95 µm, thus indicating that light will not efficiently enter the photodetectors 5b even if the radius of curvature of the on-chip lenses is made any smaller. Herein, 2.46 µm is selected as a radius of curvature under which the light entering the photodetectors 5b takes on a red color even when on-chip lenses are employed.

However, even when on-chip lenses with a radius of curvature of 2.46 µm are employed, the transmittance of light entering the photodetectors 5b stays below 100%. This is presumably because incident white light is not efficiently converged on the photodetectors 5b, and red diffracted light entering from the adjacent pixels is vignetted due to the restricted aperture. A presumable reason why incident white light is not efficiently converged on the photodetectors 5b may be a light diffraction phenomenon occurring as the light is led through the periodical array of on-chip lenses, this diffracted light being vignetted by interconnects and the like. In order to take these results into consideration, we have arrived at the concept of employing high refractive index layers above the photodetectors 5b to converge light from around the high refractive index layers, thereby allowing light to efficiently enter the photodetectors 5b.

Figure 12:
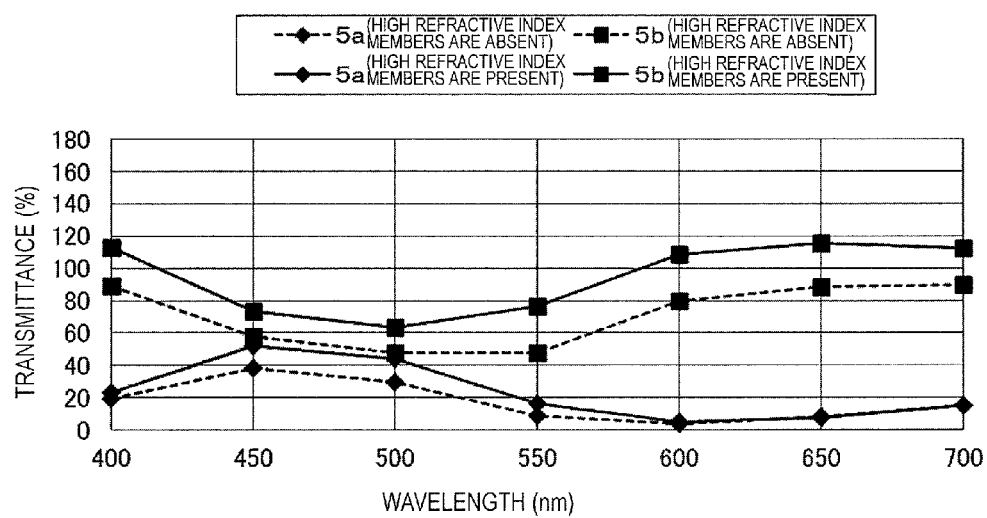
FIG. 12 A diagram showing the optical characteristics of light entering photodetectors in the case where high refractive index members according to an exemplary embodiment exist and in the case where they don't.

FIG. 12 shows a spectrum of light entering the photodetectors 5a and 5b when high refractive index members 6 of the same shape as that of Embodiment 1 are provided. It can be seen that the transmittance of light which is detected at each photodetector 5b is increased at each wavelength. This is presumably because the high refractive index members 6 allow light from around the high refractive index members 6 to be converged on the central portions of the pixels, so that light is entering the photodetectors 5b more efficiently. Thus, by providing the high refractive index members 6 so as to converge a greater amount of light from around the high refractive index members 6, it becomes possible to converge light which is unable to enter a limited aperture region with the use of on-chip lenses alone, thereby enhancing the efficiency of light utilization.

Although reflow lenses are employed as the on-chip lenses in the present embodiment, digital microlens which provide a similar convergence effect may also be employed.

Embodiment 4

Figure 13:
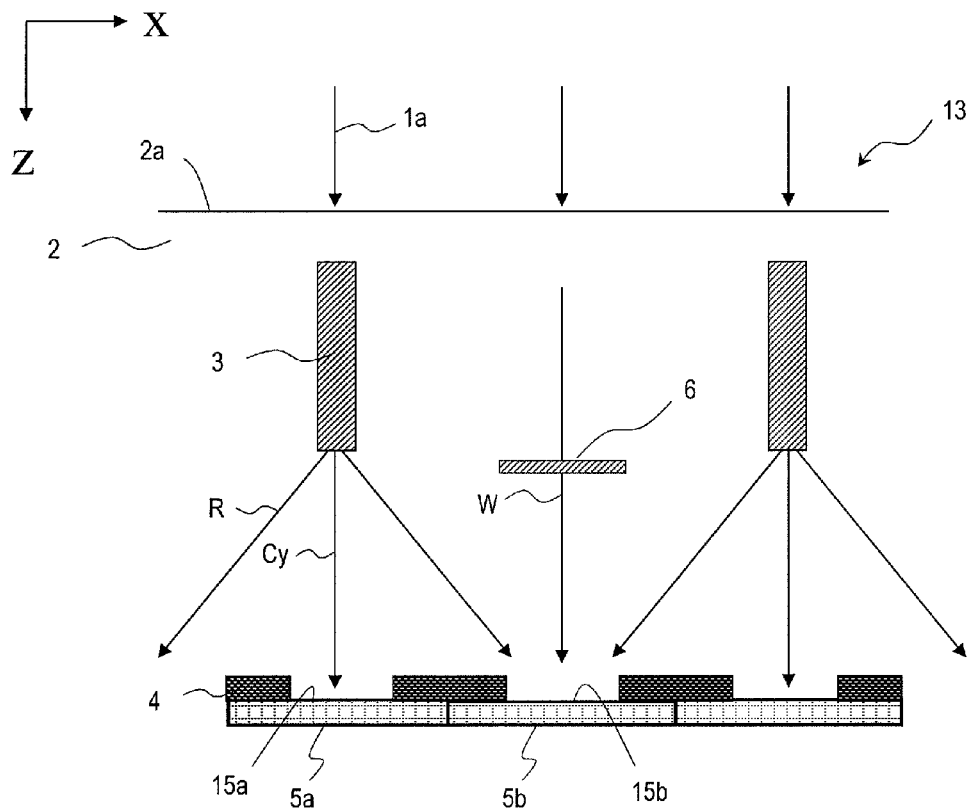
FIG. 13 A diagram showing an imaging apparatus according to an exemplary embodiment.

FIG. 13 is a cross-sectional view showing an imaging apparatus 13 according to Embodiment 4 of the present invention. In this example, orthogonal projections of the spectroscopic portions 3 onto the light-receiving surface do not overlap orthogonal projections of the high refractive index members 6 onto the light-receiving surface. Moreover, along the optical axis direction, the high refractive index members 6 are disposed at positions which are closer to the spectroscopic portions 3 than to the light-receiving surface. In the example shown in FIG. 14, the high refractive index member 6 is disposed near the lower end of the spectroscopic portion 3. With such an arrangement, the diffraction angles of $\pm 1^{st}$ order diffracted light occurring from the spectroscopic portion 3 are increased over the case where no high refractive index member 6 is provided, and over the case where the high refractive index member 6 is disposed at a position which is close to the light-receiving surface.

Figure 14:
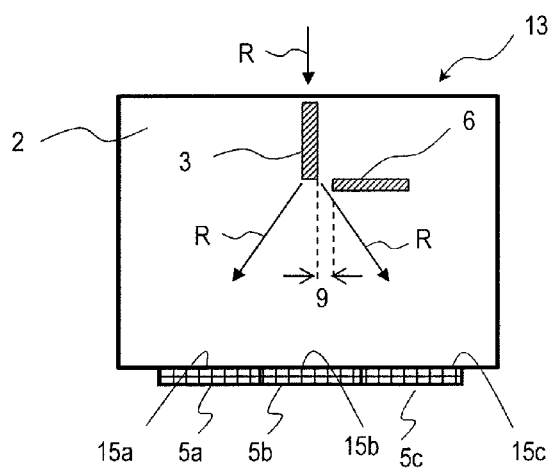
FIG. 14 A diagram showing an imaging apparatus according to an exemplary embodiment.

Hereinafter, the imaging apparatus 13 of the present embodiment will be described in more detail. A spectroscopic portion 3 for separating incident red light R into $\pm 1^{st}$ order light, a high refractive index member 6, and photodetectors 5a, 5b, and 5c are disposed as shown in FIG. 14. In FIG. 14, in order to clarify the spread of the diffraction angles of the $\pm 1^{st}$ order diffracted light due to the high refractive index member 6 being provided, the high refractive index member 6 is disposed only above the photodetector 5c, and not above the photodetector 5a. Note that the high refractive index member 6 has the same shape as in Embodiment 1.

Figure 15:
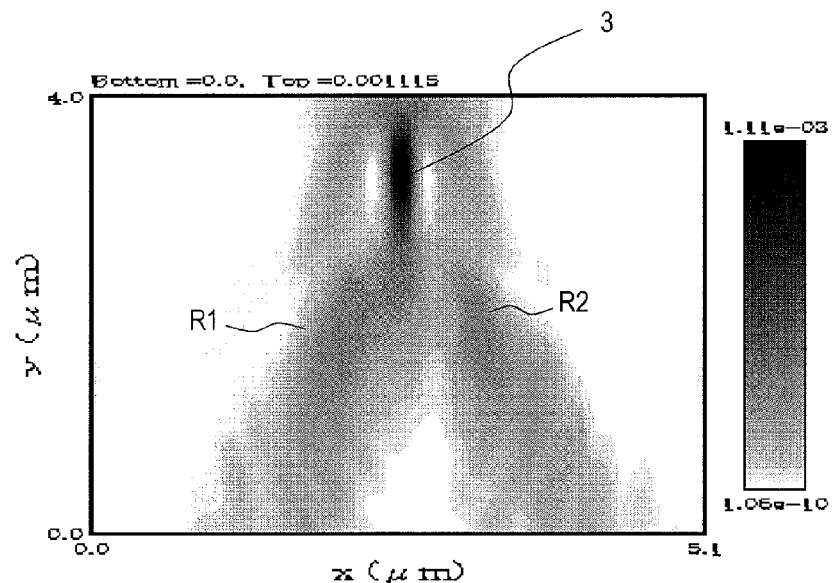
FIG. 15 A diagram showing a cross-sectional intensity distribution of light when light enters a spectroscopic portion according to an exemplary embodiment.

FIG. 15 shows a cross-sectional intensity distribution of light when, in the structure shown in FIG. 14, red light with an Airy disk diameter of 2.2 µm is incident on the spectroscopic portion 3. The darker the indication is, the greater the light intensity is. When red light passes through the spectroscopic portion 3, it separates into diffracted light R1 and R2. It can be seen that the diffraction angle of the diffracted light R2, which becomes separated toward the side where the high refractive index member 6 is provided, is greater than the diffraction angle of the diffracted light R1, which becomes separated toward the side where the high refractive index member 6 is not provided.

Figure 16:
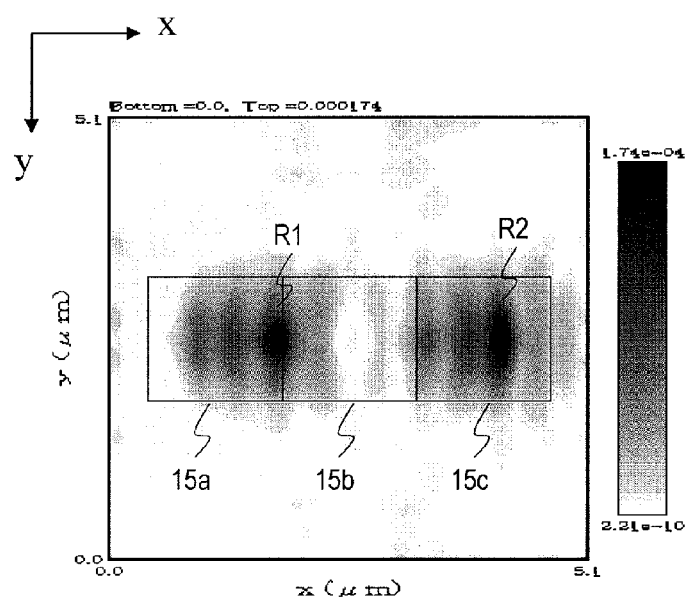
FIG. 16 A diagram showing a light intensity distribution at the light-receiving surface of photodetectors according to an exemplary embodiment.

FIG. 16 shows a light intensity distribution at the light-receiving surface 15a, 15b, 15c of the photodetectors in FIG. 14. Boundaries between the photodetectors are indicated by solid lines. The diffracted light R1 and the diffracted light R2 enter respectively different photodetectors. It can be seen that the diffracted light R1 is incident astride the photodetectors 15a and 15b but that the diffracted light R2 is incident concentratedly on the photodetector 15c. Providing the high refractive index member 6 allows to increase the diffraction angle of the diffracted light R2 so that it is incident on the desired photodetector. On the other hand, in the case where the high refractive index member 6 is not provided, in order to allow the diffracted light R1 to be incident concentratedly on the photodetector 15a while conserving the interspaces between the photodetectors 15a, 15b, and 15c as shown in FIG. 16, it is necessary to further increase the thickness between the spectroscopic portion 3 and the photodetectors. However, by also providing a high refractive index member 6 at the side of the diffracted light R1, it becomes possible to increase the diffraction angle of the diffracted light R1 so that it is incident on the desired photodetector. Thus, as compared to the case where no high refractive index members 6 are provided, providing high refractive index members 6 so that the diffraction angles of the diffracted light R1 and R1 will spread allows the imaging device to become a thin film.

Figure 17:
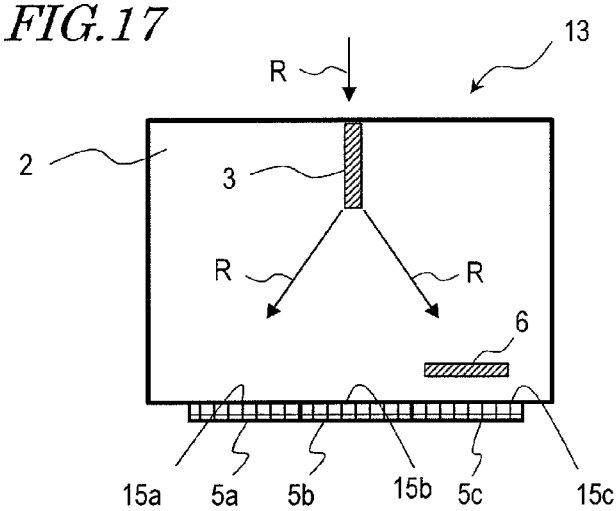
FIG. 17 A diagram showing an imaging apparatus according to an exemplary embodiment.
Figure 18:
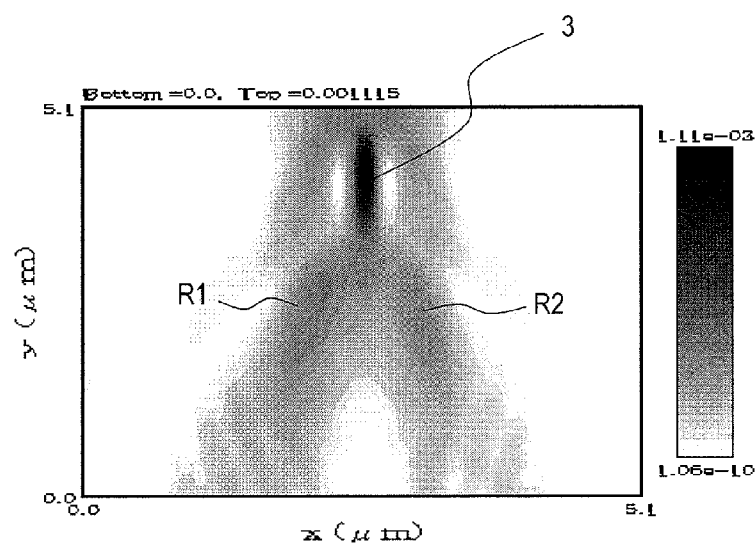
FIG. 18 A diagram showing a cross-sectional intensity distribution of light when light enters a spectroscopic portion according to an exemplary embodiment.
Figure 19:
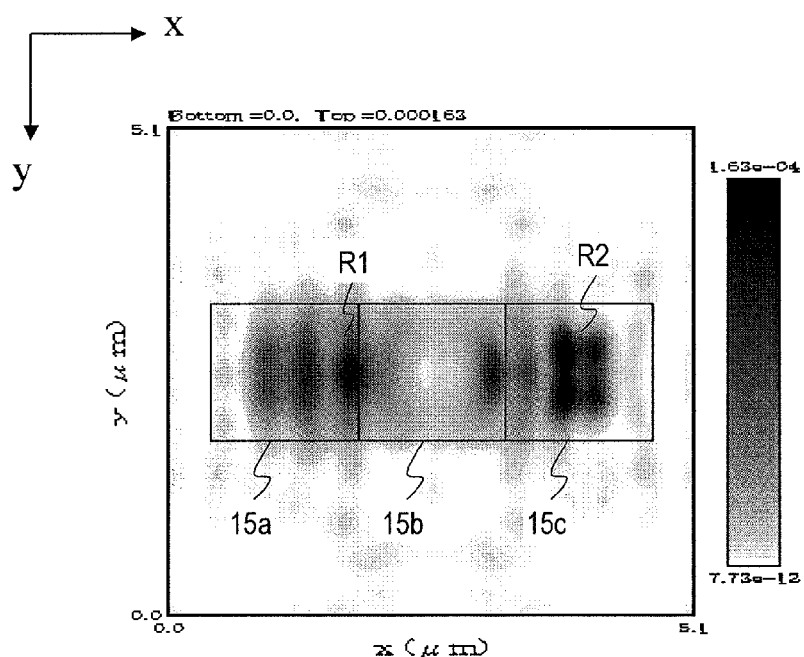
FIG. 19 A diagram showing a light intensity distribution at the light-receiving surface of photodetectors according to an exemplary embodiment.

FIG. 17 is a cross-sectional view where the high refractive index member 6 of FIG. 14 is positioned 0.4 µm above the photodetector surface, in a manner similar to FIG. 3 illustrating the first embodiment. As compared to FIG. 14, the high refractive index member 6 is placed at a position which is close to the light-receiving surface along the optical axis direction. The shapes of the spectroscopic portion 3 and the high refractive index member 6 are the same as those in FIG. 14. FIG. 18 shows a cross-sectional intensity distribution of light when, in the structure of FIG. 17, red light with an Airy disk diameter of 2.2 µm is incident on the spectroscopic portion 3. It can be seen that, although red light is separated into diffracted light R1 and R2 as it passes through the spectroscopic portion 3, they have mutually similar diffraction angles. FIG. 19 shows a light intensity distribution at the light-receiving surface 15a, 15b, 15c of the photodetectors in FIG. 17. It can be seen that the diffracted light R2 is incident astride the photodetectors 15b and 15c. In summary, as shown in FIG. 14, by disposing the high refractive index member 6 at a position which is closer to the spectroscopic portion 3 than to the light-receiving surface along the optical axis direction (e.g., near the lower end of the spectroscopic portion 3), there is provided an effect of widening the diffraction angles of the $\pm 1^{st}$ order diffracted light. This makes it possible to narrow the interspace between the spectroscopic portion and the photodetectors that are disposed at predetermined interspaces, thereby reducing the thickness of the imaging device.

Moreover, in FIG. 14, as the distance 9 between the high refractive index member 6 and the plane of the spectroscopic portion 3 increases, the effect of spreading the diffraction angle decreases; as the distance decreases, the effect of spreading the diffraction angle increases.

Although Embodiments 1 to 4 above illustrate that the high refractive index members 6 have rectangular cross-sectional shapes, the effects of the present invention will be attained so long as a higher refractive index than that of the surroundings is available, even if shape alterations may occur due to the formation process of the high refractive index members 6 (e.g., the cross-sectional shape becoming trapezoidal, or having rounded corners).

Moreover, the imaging apparatus according to the present invention may be applied to both CMOS-type imaging devices and CCD-type imaging devices. Moreover, the imaging apparatus according to the present invention may be applied to imaging devices of a rear-irradiation type having interconnects embedded within Si, and to imaging devices in which an organic photoelectric conversion film is used.

INDUSTRIAL APPLICABILITY

An imaging apparatus according to one implementation of the present invention is especially useful in technological fields where imaging devices are employed, e.g., digital cameras, digital movie cameras, and imaging sensors.

REFERENCE SIGNS LIST 1, 10, 11, 12 imaging apparatus
2 transparent layer
2a light-entering surface
3 spectroscopic portion
4 light shielding portion
5a, 5b photodetector
6 high refractive index transparent member
6a high refractive index layer
8 on-chip lens
15a, 15b light-receiving surface

The invention claimed is:

1. An imaging apparatus comprising:
a plurality of photodetecting portions;
a transparent layer provided at the side of a light-receiving surface of the plurality of photodetecting portions;
a plurality of spectroscopic portions provided between a light-entering surface of the transparent layer and the plurality of photodetecting portions; and
a plurality of high refractive index transparent members disposed closer to the plurality of photodetecting portions than are the plurality of spectroscopic portions,
wherein,
the plurality of high refractive index transparent members have a higher refractive index than does the transparent layer;
orthogonal projections of the plurality of spectroscopic portions onto the light-receiving surface do not overlap those of the plurality of high refractive index transparent members;
$+1^{st}$ order diffracted light and $-1^{st}$ order diffracted light, into which light is separated as the light passes through the transparent layer and one of the spectroscopic portions, are incident on respectively different ones of the photodetecting portions; and
the high refractive index transparent members are disposed so that diffraction angles of the $+1^{st}$ order diffracted light and the $-1^{st}$ order diffracted light become more spread than without the high refractive index transparent members.

2. The imaging apparatus of claim 1, wherein,
each spectroscopic portion is shaped so that a length thereof along a direction which is perpendicular to the light-receiving surface is longer than a length thereof along a direction which is parallel to the light-receiving surface; and
each high refractive index transparent member is shaped so that a length thereof along a direction which is parallel to the light-receiving surface is longer than a length thereof along a direction which is perpendicular to the light-receiving surface.

3. The imaging apparatus of claim 1, wherein,
the spectroscopic portions are disposed so as to correspond to every other one of the plurality of photodetecting portions.

4. The imaging apparatus of claim 1, wherein a light shielding portion is provided at a boundary portion between the photodetecting portions.

5. The imaging apparatus of claim 4, wherein the high refractive index transparent members are provided above those areas of the light-receiving surface of the plurality of photodetecting portions where the light shielding portion is not provided.

6. The imaging apparatus of claim 1, wherein an on-chip lens is provided at the side of the light-entering surface of the transparent layer.

7. The imaging apparatus of claim 1, wherein a face of each high refractive index transparent member along a direction which is parallel to the light-receiving surface is rectangular or circular.

8. The imaging apparatus of claim 1, wherein, along a direction which is perpendicular to the light-receiving surface, the high refractive index transparent members are disposed at positions which are closer to the spectroscopic portions than to the light-receiving surface.

* * * * *